US007966548B2

(12) United States Patent
Jacobsen et al.

(10) Patent No.: US 7,966,548 B2
(45) Date of Patent: Jun. 21, 2011

(54) METHOD AND SYSTEM FOR ENCODING DATA USING RATE-COMPATIBLE IRREGULAR LDPC CODES BASED ON EDGE GROWTH AND PARITY SPLITTING

(75) Inventors: Noah Jacobsen, Morristown, NJ (US); Robert Atmaram Soni, Randolph, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1026 days.

(21) Appl. No.: 11/824,408

(22) Filed: Jun. 29, 2007

(65) Prior Publication Data

US 2009/0006906 A1    Jan. 1, 2009

(51) Int. Cl.
*H03M 13/35* (2006.01)
(52) U.S. Cl. ...................................................... 714/774
(58) Field of Classification Search .................. 714/774
See application file for complete search history.

(56) References Cited

U.S. PATENT DOCUMENTS

| | | | |
|---|---|---|---|
| 6,567,465 B2 | 5/2003 | Goldstein et al. | |
| 7,171,603 B2* | 1/2007 | Classon et al. | 714/752 |
| 7,502,987 B2* | 3/2009 | Kyung et al. | 714/781 |
| 7,702,986 B2* | 4/2010 | Bjerke et al. | 714/755 |
| 7,743,315 B2* | 6/2010 | Li et al. | 714/801 |
| 7,757,150 B2* | 7/2010 | Stolpman | 714/752 |
| 7,802,164 B2* | 9/2010 | Hong et al. | 714/752 |
| 2006/0036926 A1 | 2/2006 | Hocevar | |
| 2007/0101233 A1 | 5/2007 | Eroz et al. | |
| 2007/0113146 A1 | 5/2007 | Li et al. | |
| 2007/0113147 A1 | 5/2007 | Hong et al. | |

OTHER PUBLICATIONS

William E. Ryan, An Introduction to LDPC Codes, Aug. 19, 2003.
Jian Sun, An Introduction to Low Density Parity Check (LDPC) Codes, WCRL Seminar Series, Jun. 3, 2003.
Jing Li (Tiffany) and Krishna R. Narayanan, Rate-Compatible Low Density Parity Check Codes for Capacity-Aproaching ARQ Schemes in Packet Data Communications, Nov. 2002.
International Search Report for PCT/US2008/008051 dated Sep. 19, 2008.
Arnold, D. M., et al, "Regular and Irregular Progressive Edge-Growth Tanner Graphs", IEEE Transactions on Information Theory, vol. 51, No. 1, Jan. 2005, pp. 386-398, US.
Good, M., et al., "Incremental Redundancy Via Check Splitting", 23RD Biennial Symposium on Communications, May 29-Jun. 1, 2006, pp. 55-58, Piscataway, NJ.
Jacobsen, Noah., et al., "Design of Rate-Compatible Irregular LDPC Codes Based on Edge Growth and Parity Splitting", Vehicular Technology Conference, Sep. 1, 2007, pp. 1052-1056.

* cited by examiner

*Primary Examiner* — Stephen M Baker
(74) *Attorney, Agent, or Firm* — McCormick, Paulding & Huber LLP

(57) ABSTRACT

In a system for parity encoding data using a low density parity check (LDPC) code, a rate-compatible, irregular LDPC code is generated by extending a base code using a constrained edge growth operation and a parity splitting operation. The base code is a "daughter" code having an encoding rate higher than a designated rate of the LDPC code. The daughter code is progressively extended to lower and lower rates such that each extension code (including the target LDPC code) is compatible with the previously obtained codes. The extension operation may involve introducing a set of new code symbols to the daughter code, by splitting check nodes of a base graph associated with the daughter code, and through constrained edge growth of the base graph. The LDPC code is used to parity encode a data message as a means for forward error correction across a communication channel.

20 Claims, 4 Drawing Sheets

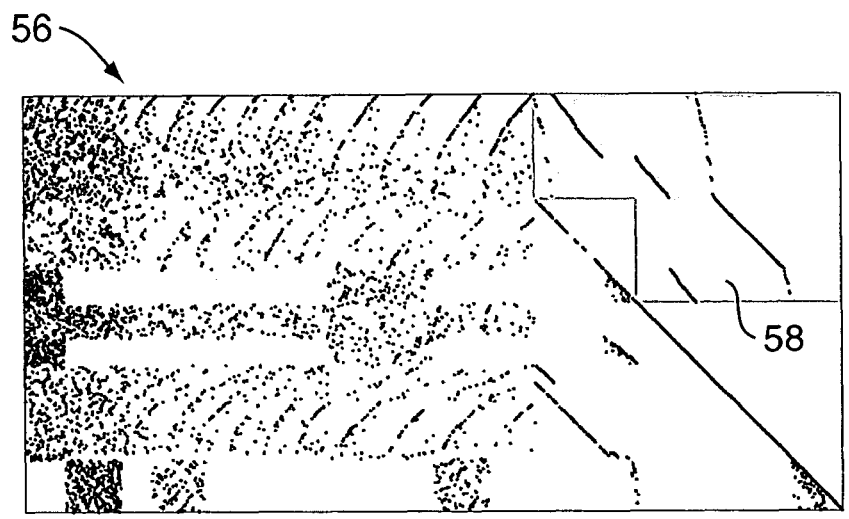
FIG. 3
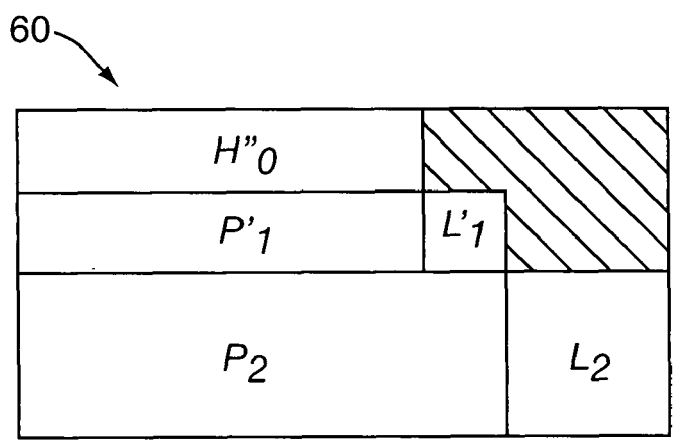
FIG. 4
$$c_{q-1}[In_{q-1}(L_q{}^{-1} P_q)^T]$$
FIG. 5

METHOD AND SYSTEM FOR ENCODING DATA USING RATE-COMPATIBLE IRREGULAR LDPC CODES BASED ON EDGE GROWTH AND PARITY SPLITTING

FIELD OF THE INVENTION

The present invention relates to signal processing in a communications context and, more particularly, to transceiver signal conditioning or encoding.

BACKGROUND OF THE INVENTION

In modern communication systems, e.g., wireless, radio frequency-based networks, communication signals are often transmitted over long distances and at high data transfer rates. For example, in a typical CDMA-based, "1x-EVDO" (Evolution Data Optimized, or Evolution Data Only) wireless network, forward link non-voice data rates (e.g., transmissions from a base station to a wireless unit) are specified up to 3.1 Mbit/sec, with reverse link rates up to 1.8 Mbit/sec in a radio channel dedicated to carrying high-speed packet data, e.g., a 1.25 MHz-bandwidth (or greater) radio channel. Because of the nature of radio wave propagation, with concomitant factors such as wideband Gaussian noise, fading, frequency selectivity, interference, nonlinearity, and dispersion, radio frequency channels tend to be noisy. As a result, a received signal may or may not match the signal as originally transmitted, e.g., the received signal may include one or more errors due to noisy channel conditions. Such errors may be exacerbated at high data transfer rates, and in any event negatively affect the data transfer rate and/or reduce the quality of the wireless transmission.

In an attempt to convey information more reliably through noisy channels, communication systems typically utilize forward error correction (FEC). FEC is a system of error control for data transmission, whereby the transmitting unit adds redundant data to the transmitted signals, which allows the receiving unit to detect and correct errors (within some bound). One method of FEC involves the use of low density parity check (LDPC) codes. LDPC codes are a class of binary (e.g., "1's" and "0's") linear block codes, whose name derives from the characteristic of the codes' parity-check matrix, which contains only a few 1's in comparison to the amount of 0's. (A parity-check matrix is a matrix/set of 1's and 0's, which, in a simplified sense, can be thought of as a function that maps an input message to an output "code word" for transmission.) LDPC codes have increased in popularity because of their near-capacity performance on a variety of data transmission channels, and because the LDPC decoding function can be implemented with a high degree of algorithmic efficiency.

While the use of LDPC codes is generally advantageous, many LDPC-based methods fail to issue the problem of rate compatibility, i.e., it is preferable that the LDPC coding scheme be compatible across a range of coding rates. Rate-compatible error-correcting codes are useful in a variety of communications engineering settings. For example, hybrid-ARQ is employed to combat fading in cellular systems. Due to channel variability, it is often more efficient to require multiple fast re-transmissions, as provided by hybrid-ARQ protocols, to ensure a successful decoding, rather then provisioning for worst case channel conditions. In the case of wireless vehicular technologies, fading rates are extremely dynamic, and rate-compatible codes are thus well suited for use in such contexts. Another application arises in deep space communication links due to large round-trip times.

Puncturing has been used in certain systems to achieve rate compatibility. Through puncturing, a series of higher rate codes are obtained from a low rate mother code. The encoder generates the full set of parity bits (e.g., bits added to the input message to make a code word), but some are not transmitted ("punctured"). The decoder inserts erasures where parities are punctured and performs the decoding algorithm as in a non-punctured case. Although puncturing may be effective in some cases, the problem with such an approach is two-fold: (1) the mother code is typically optimized for efficient operation at low rates, and subsequently exhibits a widening gap to capacity as the amount of puncturing increases, and (2) optimizations of code structure and puncturing patterns are treated separately, which is suboptimal.

SUMMARY OF THE INVENTION

An embodiment of the present invention relates to a system and method for processing data in a communications context, e.g., for parity encoding of data using a low density parity check (LDPC) code. In the system, a rate-compatible, irregular LDPC code is generated through extension of a base code. Subsequently, the LDPC code (and/or a parity check matrix associated with the LDPC code) is used to encode a data message. The encoded data message is then transmitted over a communication channel for reception and decoding at a receiving unit. The base code is a "daughter" code having an encoding rate higher than a target or designated rate of the LDPC code. The base code is extended using a hybrid of constrained edge growth and parity splitting operations, which is capable of producing rate-compatible LDPC codes with a uniform gap to capacity over a wide range of rates, e.g., less than 1 dB at moderate block lengths.

In another embodiment, the daughter code is progressively extended to lower and lower rates such that each extension code is compatible with the previously obtained codes. The daughter code may be extended by introducing a set of new code symbols to the daughter code. The number of new code symbols is a function of the rate of the daughter code and the target rate of the LDPC code. Some of the new code symbols (e.g., a designated portion) are generated by splitting check nodes of a base graph associated with the daughter code. The remaining new code symbols are generated by constrained edge growth of the base graph.

In another embodiment, the rate-compatible LDPC codes exhibit optimized degree distributions for their corresponding rates. Such code-theoretic optimizations yield rate-compatible LDPC codes with efficient performance characteristics even at practical block lengths. The LDPC codes may be optimized based on one or more extrinsic-information transfer (EXIT) charts. Density evolution based techniques are also applicable to optimizing the rate-compatible codes.

In another embodiment, the rate-compatible LDPC codes are viewed as "redundancy on demand," which is often applicable to packet data communication systems. Here, redundancy is generated and transmitted as needed by the encoder/transmitter and/or as determined by the transmitter/receiver pair. Further, any of the redundant packets (code-rates) may be viewed as optimized for efficiency of communication (e.g., power or bandwidth efficiency). At any given re-transmission, the encoder chooses a rate from the set of supported rates, which is lower than the previous transmission rate, and generates appropriate redundant bits with linear block encoding operations. This relaxes the computational load at the encoder when it is a priori unknown which communication rate is optimal.

In another embodiment, the method of encoding rate-compatible LDPC codes via the extension technique herein gives rise to simplified decoder processing. Here the code is viewed as "puncture-less," since any given codeword from the set of compatible codewords is decoded only with its corresponding parity sub-matrix, and not with a decoder that inserts zero-LLR values for punctured bits while operating on the code of lowest rate (i.e., largest parity matrix). This represents a decoding complexity advantage for rate-compatible codes produced with the edge growth and parity splitting technique.

BRIEF DESCRIPTION OF THE DRAWINGS

The present invention will be better understood from reading the following description of non-limiting embodiments, with reference to the attached drawings, wherein below:

FIG. 3 is a scatter-plot representation of an example irregular LDPC Tanner graph;

FIG. 4 is a graph shown parity-check matrix decomposition for recursive encoding corresponding to the example shown in FIG. 3;

FIG. 5 is an extension-related equation;

DETAILED DESCRIPTION

Figure 2:
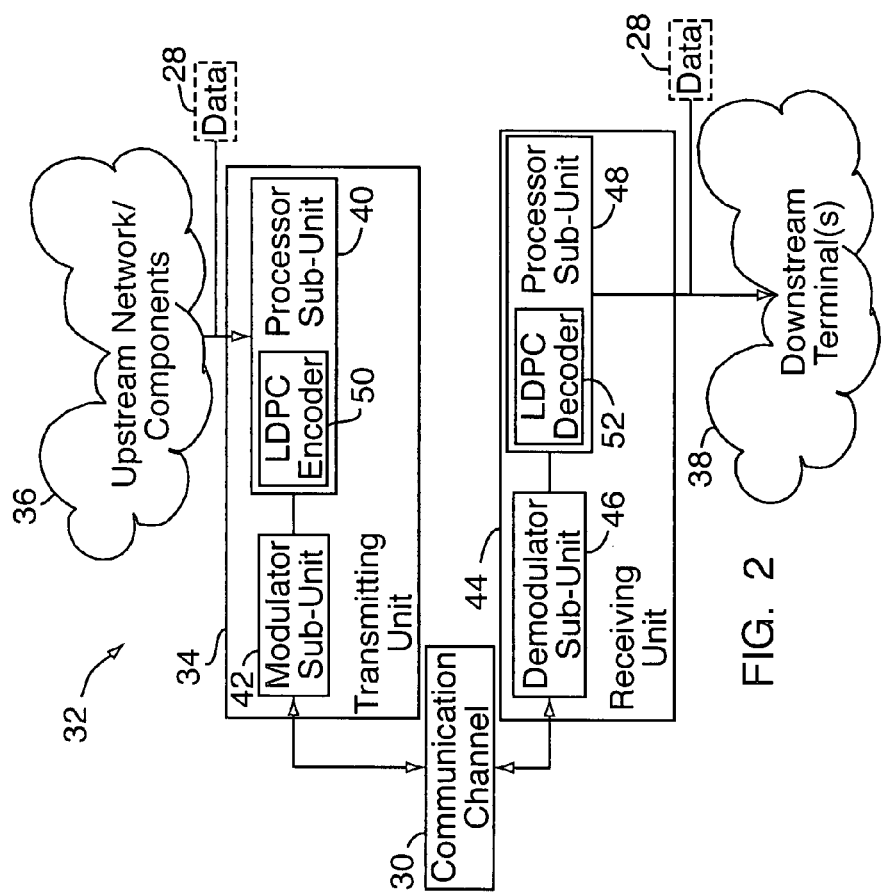
FIG. 2 is a schematic diagram of a typical communication system.
Figure 1:
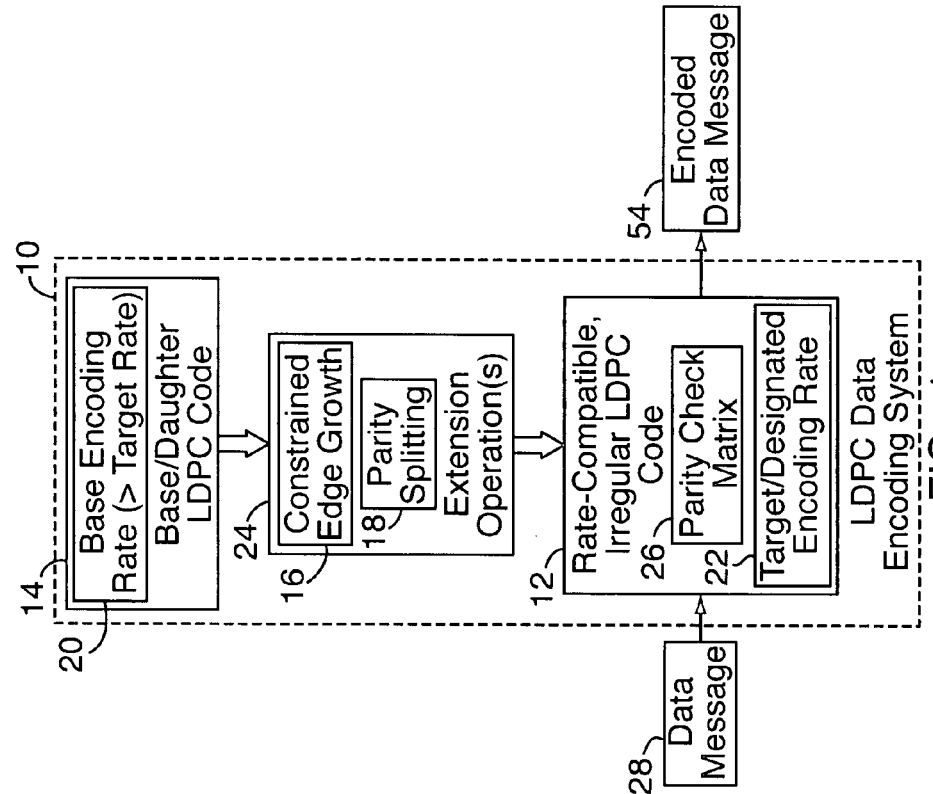
FIG. 1 is a schematic diagram of an LDPC encoding/FEC system according to an embodiment of the present invention.

With reference to FIGS. 1-8, an embodiment of the present invention relates to a system and method 10 for processing data in a communications context, e.g., for parity encoding data using a low density parity check (LDPC) code 12. In the system 10, a rate-compatible, irregular LDPC code 12 is generated by extending a base code 14 using a constrained edge growth operation 16 and a parity splitting operation 18. The base code 14 is a "daughter" code having an encoding rate 20 higher than a target or designated rate 22 of the LDPC code 12. The daughter code 14 is progressively extended to lower and lower rates such that each extension code (including the target LDPC code 12) is compatible with the previously obtained codes. The extension operation 24 may involve introducing a set of new code symbols to the daughter code 14. The number of new code symbols is a function of the rate of the daughter code and the target rate of the LDPC code. Some of the new code symbols (e.g., a designated subset/percentage) are generated by splitting check nodes of a base graph associated with the daughter code. The remaining new code symbols are generated by constrained edge growth of the base graph. The LDPC code 12 (or a parity check matrix 26 associated with the LDPC code) is used to parity encode a data message 28, e.g., as a means for forward error correction across a communication channel 30.

As should be appreciated, the extension framework 24 utilized in the system 10 is a hybrid of edge growth 16 and parity splitting 18, which is capable of producing rate-compatible LDPC codes 12 with a uniform gap to capacity over a wide range of rates, e.g., less than 1 dB at moderate block lengths.

Typically, the system 10 will be implemented for use in a network or other communication system 32. In the network 32, data 28 is received at a transmitting unit 34 from an upstream network entity 36. (The data 28 may be designated for receipt by a particular end user 38, e.g., mobile phone, computer terminal, or the like, or by many users such as in broadcast or multi-cast systems.) The data 28 is processed by a processing sub-unit 40 of the transmitting unit 34, if necessary, and modulated by a modulator sub-unit 42 for transmission over a communication channel 30, e.g., a radio channel. The transmitted data is received at a designated receiving unit 44. The receiving unit 44 includes a demodulator sub-unit 46 for demodulating the received data, and a processing sub-unit 48 for further processing the received data. Because the communication channel 30 may exhibit noisy conditions, the transmitting unit 34 and receiving unit 44 are configured to incorporate (or otherwise work in conjunction with) the encoding system 10 as a means for forward error correction. For this, the transmitting unit 34 may include an LDPC encoder 50, as part of the processing sub-unit or otherwise, that is configured to carry out the LDPC encoding method described herein. Similarly, the receiving unit 44 includes an LDPC decoder 52 specifically for decoding the encoded data message 54 produced by the LDPC encoder 50.

As indicated above, the system 10 produces rate-compatible parity-check matrices 26 of flexible and dynamic rate. The parity-check matrices 26 are generated by extending a daughter code parity matrix 14 using a hybrid of constrained edge growth 16 and parity splitting 18, as now described in more detail.

Regarding edge growth, encoding and decoding of LDPC codes are typically developed with their Tanner graph representations. Edge growth algorithms, in particular progressive edge growth (PEG) algorithms, are able to produce Tanner graphs with good girth, which relates to improved minimum distance characteristics. More generally, such algorithms emphasize graph connections that benefit the performance of message passing decoding. Finite graphs produced by edge growth according to asymptotically optimal degree distributions have exhibited a robust performance, especially for high-rate and short block-length codes, and are employed here for constructing the daughter code (the high-rate base code 14), as well as in motivating the extension technique described herein.

Specifically, the PEG algorithm sequentially and greedily assigns edges in the graph such that the resulting local girth (length of the shortest cycle involving a new edge) is maximized. Edges are assigned one-by-one in order of increasing variable-degree, and, if desired, according to a given check-degree distribution (otherwise, the check-degrees are concentrated around their mean-value as related to the variable-degree distribution and code-length). Other variations of edge growth algorithms emphasize cycle connectivity in choosing which edges to add. Cycles that are well connected to the rest of the graph benefit from a better mix of uncorrelated information regarding their code-bits in message passing decoding.

Edge growth algorithms are readily modified to extend a base graph according to specific degree distributions. This is referred to as constrained edge growth, since the base graph places constraints on both check- and variable-degree distributions of subsequent extension graphs. In using edge growth for extension as such, edges are only added to variable-nodes that exhibit a degree increase, with some variable-nodes potentially receiving no new edges. Constrained edge growth is able to closely match optimal variable-degree distributions over a course of many rates. It is mainly due to finite block-lengths and check-degree constraints that a pure edge growth approach is incapable of producing rate-compatible parity matrices of good performance. Thus, in the system 10, both edge-growth, for its variable-degree flexibility, as well as parity splitting (or check splitting), for exerting a level of control over the parity-degree distribution, are used to construct rate-compatible graphs.

Regarding parity splitting, check-irregular constructions (where both the check and variable node degrees are varied), although forming a larger class of irregular LDPC codes, tend to perform worse than check-regular constructions, in which all check nodes are of the same degree. Anecdotal evidence suggests that it is much easier to construct good check-regular graphs at finite block lengths since the burden of variable-irregularity (in terms of local girth) is evenly distributed amongst the parity nodes. Thus, as a general principle, check-degrees of the extension codes are typically made as concentrated as possible around their desired average degree, namely $d_{opt}(r)$, which is monotone increasing in the rate and given by density evolution.

A parity check equation may be split into multiple parity equations by introducing new degree-two symbol nodes. For example, suppose the set $A=\{x_0, \ldots, x_{d-1}\}$ represents code-bits involved in a degree-d parity constraint: $\Sigma_{x \in A} x=0$. Then, letting $x_d$ denote a new degree-two code symbol, the given parity equation is split into two: the first involving bits $A_1 \cup \{x_d\}$, and the second involving bits $A_2 \cup \{x_d\}$, where $A_1$ and $A_2$ are disjoint and $A=A_1 \cup A_2$. Thus, if the new constraints have degrees $d_1$ and $d_2$, respectively, then $d_1+d_2=d+2$ must hold. This operation increases the number of check constraints by one, creating the incremental redundancy bit, $x_d$, while preserving the base code structure. (Note that adding the new parity equations returns the original.) A redundancy-bit produced by parity splitting is computed with either of the resulting representations. Moreover, with the exception of a new degree-two code-bit, the variable-node degree distribution remains the same.

Parity splitting is a practical method for creating rate-compatible parity matrices, since large degree check nodes in the base graph are converted into multiple nodes of smaller degree in extending graphs. Further, parity splitting is essentially a rate-less technique, since redundancy is produced at the bit-level. Yet, the technique offers no flexibility over the resulting variable degree distribution, and is therefore incapable of producing rate-compatible codes with optimal degree distributions. Thus, a hybrid approach is utilized in the system 10, in which edge-growth is utilized for creating good graphs with appropriate variable-node degree distributions, and parity splitting is utilized for concentrating check-degrees as the base codes are extended.

A rate-½ parity-check matrix, compatible with a rate-⅘ and rate-⅔ code, is constructed with the preceding design approach. FIG. 3 is a scatter-plot representation 56 of the irregular LDPC Tanner graph obtained for an information block size of k=600 bits. Columns in the figure represent variable-nodes of the graph, and rows represent the check-nodes. Accordingly, dots indicate edges connecting code-bits to parity-constraints. The gray shaded region 58 indicates that an edge has arisen when the incident parity-node is split, yielding the incident code-symbol. Any new code-symbol without an edge in the grey shaded region is given by edge growth, which is further constrained to be lower-triangular over the new-code symbols.

For encoding, the encoder is developed as a simple recursion, where extending code-words are computed via matrix multiplication with base code-words. For this, the following notation is used: the parity extending sub-matrix of the qth extension code is given by $[P_q \, L_q]$. In general, $P_q$ is an $l_q \times n_{q-1}$ sparse matrix, where $n_q$ denotes the length of the qth code and $l_q$ denotes the number of new code-symbols, so that $l_q=n_q-n_{q-1}$. Similarly, $L_q$ is an $l_q \times l_q$ sparse (and lower-triangular) matrix. FIG. 4 illustrates the parity extending sub-matrix $[P_2 \, L_2]$, corresponding to Example 1, where a rate-½ code extends a rate-⅔ base code. (FIG. 4 shows the parity-check matrix decomposition 60 for recursive encoding corresponding to the example shown in FIG. 3.)

Assuming $L_q$ is invertible, and that rows of $P_q$ are linearly independent, it is easy to show that Equation 62, shown in FIG. 5, extends the base code-word $c_{q-1}$ to code-word $c_q$, where $I_n$ denotes the n×n identity matrix. The extension algorithm developed constrains $L_q$ to be lower-triangular and invertible (in fact, $L_q$ tends to be easily invertible, as observed for $L_2$ in FIG. 4), and it is straight forward to solve $L_q^{-1} P_q$ by Gaussian elimination. Note that when the base graph is extended, any of its parity constraints are potentially split, thus the following nomenclature is adopted: any sub-matrix X of the base graph becomes X' in the extending graph.

The optimization framework for extending irregular LDPC codes 14 to lower rates will now be described in more detail, and examples based on extrinsic-information transfer (EXIT) chart optimizations are provided. Since EXIT charts rely on large code-word asymptotics, the optimization framework is essentially independent of information block-length, and thus one family of optimized degree distributions may be used to produce rate-compatible codes, for the same set of rates, for multiple information block-lengths.

Given a base graph 14 of rate $r_{n-1}$ (where $r_{n-1}$ is the base rate 20—see FIG. 1) and a target rate 22 of $r_n<r_{n-1}$, a fraction $\gamma=1-r_n/r_{n-1}$, relative to the extending code-word length, of new code symbols are introduced. First, a certain fraction, namely $\alpha$, of the new code symbols are obtained by splitting check nodes of the base graph. This yields a fraction $\alpha\gamma$ of new degree-two variable nodes. Then, the remaining $1-\alpha$ new code symbols are developed by constrained edge growth. Thus, $\alpha$ and the extension graph check- and variable-degree distributions are the variables to be optimized. Optimization constraints are given by the base graph check- and variable-degree distributions, and the extending rate, $r_n$.

For simplified optimization, it is assumed that all parity nodes are divided evenly, that they are split in order of largest degree, and that all new parity constraints developed by edge growth have the same, possibly fractional degree, $d_n$. A fractional degree in this context is interpreted as an average degree arising from two consecutive integers. A heuristic, which attempts to concentrate the check-degrees around their optimal mean-value, $d_{opt}(r_n)$ is used to choose $\alpha$. Thus, with $\alpha$ and the base graph check-distribution specified, choosing $d_n \approx d_{opt}(r_n)$ suffices to describe the extending graph check-distribution, while adhering to the concentration heuristic. Finally, EXIT chart matching is employed to optimize the variable-degree distribution with afore mentioned constraints, including the constraint of $\alpha\gamma$ new degree-two variable-nodes introduced by parity splitting.

Figure 6:
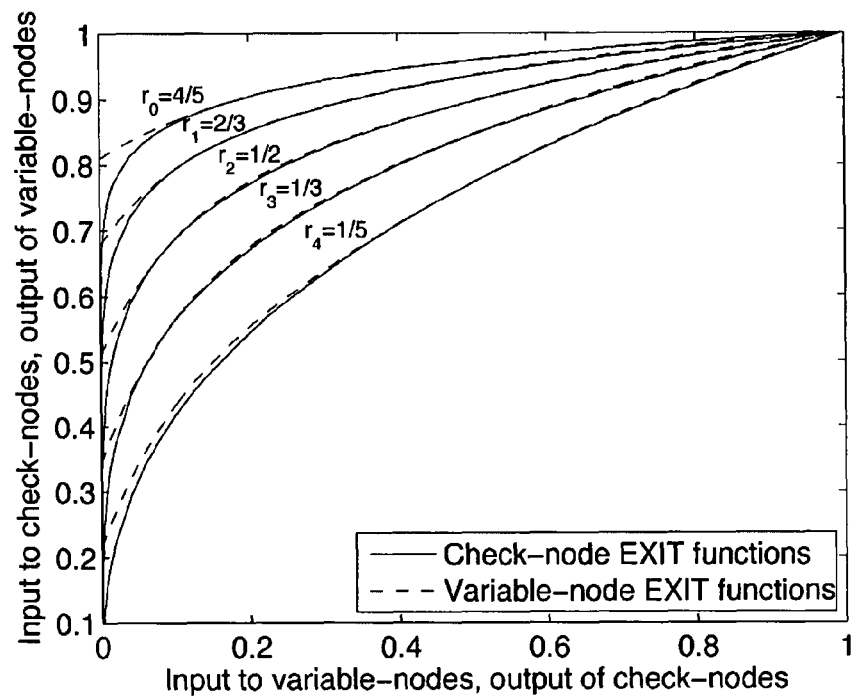
FIG. 6 is a graph showing optimized EXIT functions with forward compatibility constraint.

FIG. 6 shows examples of EXIT charts of rate-compatible codes that result from constrained optimization according to the extension framework used in the system 10. The EXIT charts consist of variable- and check-node transfer functions that express an input-output mutual information relationship regarding the estimated code-bits and LLR's computed in message passing decoding. Starting from the daughter code and progressively optimizing extension codes in order of decreasing rate places the most stringent constraints on the lowest-rate code, and therefore a performance degradation is expected at low-rates. An optimization framework that employs reverse- and forward-compatibility constraints could be used to emphasize an arbitrary member of the rate-compatible family of codes. However, codes generated in the system 10 utilize a forward-compatible constrained optimization as described, which emphasizes the daughter code (i.e., the first transmission).

Figure 7:
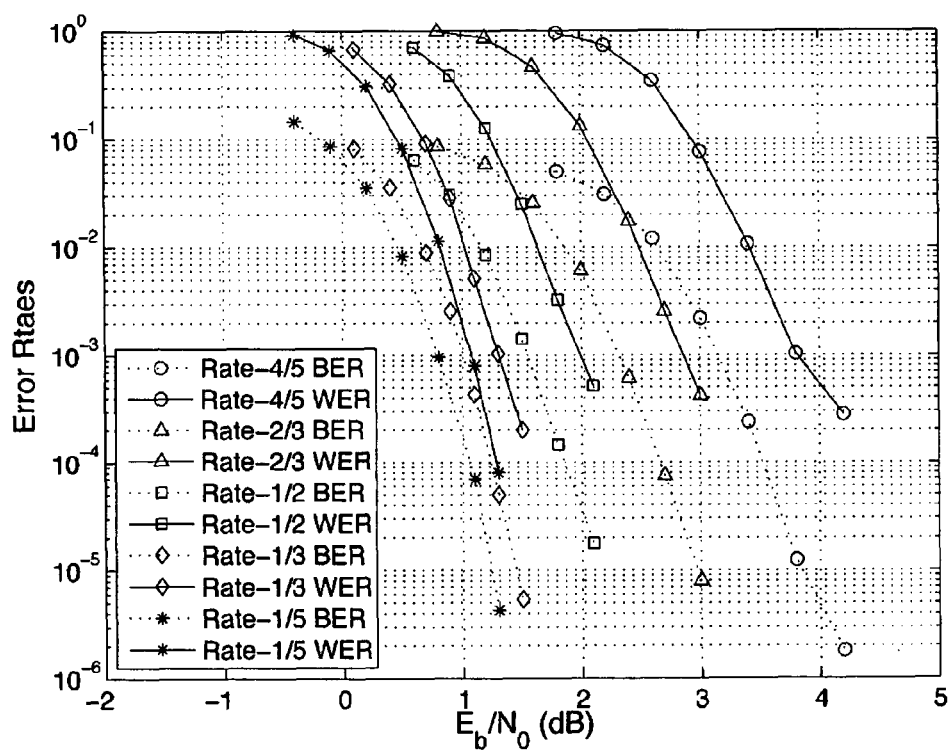
FIG. 7 is a graph showing the performance of example rate-compatible, irregular LDPC codes generated in the system.
Figure 8:
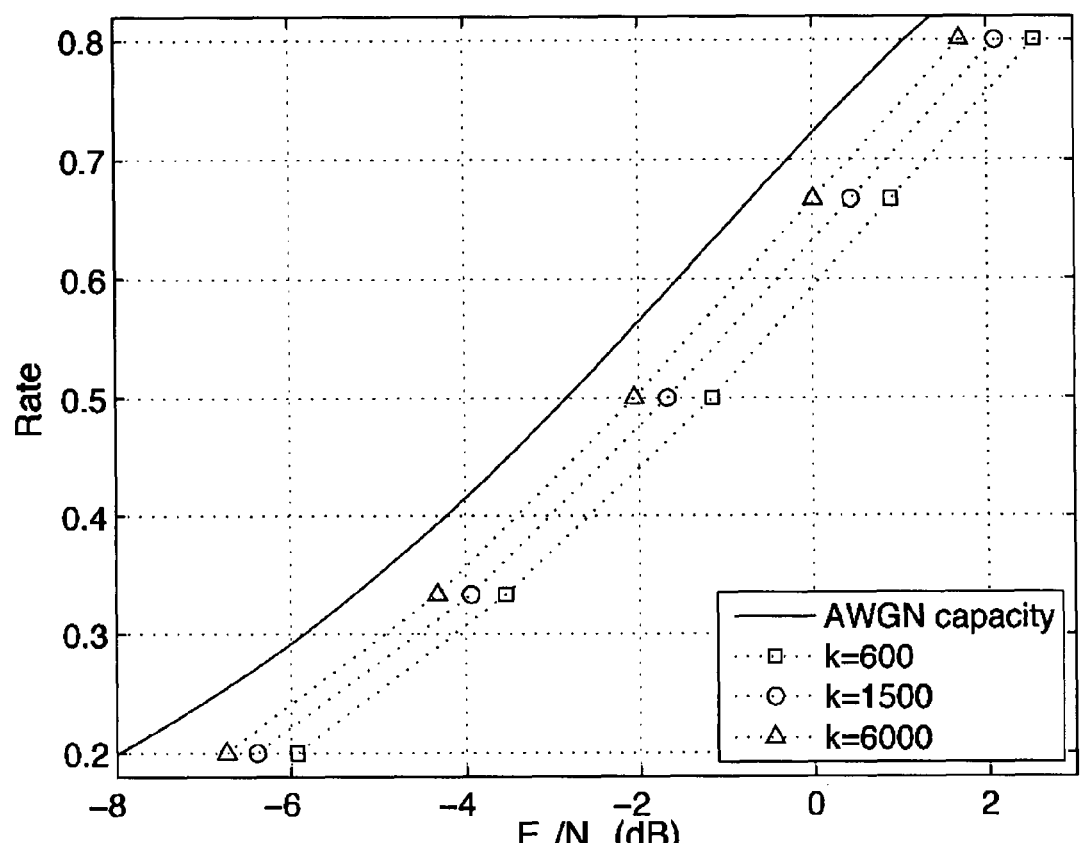
FIG. 8 is a graph showing the gap to capacity of the rate-compatible codes in FIG. 7.

Example results of the system 10 are shown in FIGS. 7 and 8. Here, rate-compatible parity matrices were constructed according to the preceding optimization framework for the following set of rates: 4/5, 2/3, 1/2, 1/3, and 1/5. The same set of optimized degree distributions is used to produce rate-compatible parity matrices for all information block-sizes. In constructing the codes, parity-nodes of largest degree are always split first. The parity splitting technique benefits slightly by incorporating a cycle connectivity metric in choosing which nodes to split, especially for the high-rate codes. Otherwise, the parities are split randomly. (Note that parity equations may be split in multiplicity, which is useful if there is a significant step-size between the base- and extension-code rate.)

FIG. 7 demonstrates the code-word error-rate (WER) and information-bit error-rate (BER) performance for an information block-size of k=600 bits. The codes demonstrate a good performance for this block-size, as compared with turbo-code benchmarks, and exhibit no significant error floors (up to WER of 1e-3).

FIG. 8 shows the gap to capacity for information block-lengths of 600, 1500, and 6000 bits, as measured at a BER of 1e-4. The results exhibit a uniform gap to capacity, less than 1 dB at k=6000, over a wide range of code rates. The gap to capacity begins to widen at low rates, in the area of rate-1/5 for the design example provided. The widening gap at low code-rates stems from the simplified optimization technique, with forward compatibility constraint, as well as difficulties with conventional irregular LDPC designs at low code-rates.

In the system 10, the extension-based development of irregular LDPC Tanner graphs is able to produce rate-compatible codes of good performance. The technique is flexible in the rates supported, and it inherently addresses the issue of puncturing, which is present for mother code based designs. Moreover, since every subcode is viewed as puncture-less, the construction also shows a decoding complexity advantage. It is believed that the proposed design technique is able to produce rate-compatible codes with a fine granularity of rates.

Standard irregular LDPC code constructions are challenged at low code-rates. This issue has been addressed in the literature with the use of pre-coding. Examples of pre-coded irregular codes on graphs include repeat accumulate (RA) style codes, and raptor codes. Such architectures bear an increased similarity with turbo-codes, which perform well at low rates. With the additional constraint of forward-compatibility, it is conjectured that the application of pre-coding techniques could benefit the performance of rate-compatible LDPC codes built by extension, as in the system 10.

Codes generated in the system 10 differ significantly from the random constructions prescribed in the prior art. Although asymptotic arguments are employed to optimize degree-distributions, the optimizations further account for the specific matrix construction, which is chosen primarily to address finite block-length considerations. At the opposite end of the spectrum are proto-graph based constructions, which are derived from several copies of a much smaller base graph, with highly structured interconnections. Proto-graph based LDPC codes, in their simplicity, offer desirable implementation advantages. However, it is conjectured here that the reduced degrees of freedom of proto-graphs leads to an increased gap to capacity. This claim is supported in comparisons with prior art systems/methods. In short, the more "random-like" flexibility of extension-style constructions should benefit their performance, if potentially at the cost increased complexity of description and implementation.

As indicated above, the rate-compatible LDPC codes may be viewed as "redundancy on demand," that is, optimized for communications efficiency (e.g., power or bandwidth efficiency). Here, redundant data is generated and transmitted as needed by the encoder/transmitter or decoder/receiver, e.g., the redundant data is generated based on feedback received from the receiver and/or on redundancy determinations made at the transmitter. At any given re-transmission, the encoder chooses a rate from the set of supported rates, which are lower than the rate of previous transmission, and generates appropriate redundant bits with linear block encoding operations. This relaxes the computational load at the encoder when it is a priori unknown which communication rate is optimal.

The method of encoding rate-compatible LDPC codes via extension technique gives rise to simplified decoder processing. Here the code is viewed as "puncture-less," since any given codeword from the set of compatible codewords is decoded only with its corresponding parity sub-matrix, and not with a decoder that inserts zero-LLR values for punctured bits while operating on the code of lowest rate (i.e., largest parity matrix). This represents a decoding complexity advantage for rate-compatible codes produced with the edge growth and parity splitting technique.

The system 10, including the LDPC encoder and decoder, may be implemented as a hardware module, hardware/software module, or software module (e.g., script or other software program, or suite of software programs), in a standalone manner and/or integrated with the processor sub-units and/or with one or more network components, for carrying out the method described herein.

Since certain changes may be made in the above-described method and system for encoding data using rate-compatible irregular LDPC codes based on edge growth and parity splitting, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method of processing data comprising:
  generating a rate-compatible low density parity check (LDPC) code, wherein the LDPC code is generated using a constrained edge growth operation and a parity splitting operation to extend a base code; and
  encoding at least a portion of a data message using at least one of the LDPC code and a parity check matrix associated with the LDPC code.

2. The method of claim 1 wherein:
  the LDPC code is an irregular LDPC code; and
  the base code is an LDPC daughter code having a code rate higher than a designated code rate of the irregular LDPC code.

3. The method of claim 2 wherein:
  the daughter code is extended by introducing a set of new code symbols to the daughter code; and
  the number of new code symbols is a function of the rate of the daughter code and the designated rate.

4. The method of claim 3 further comprising:
  generating a first subset of the new code symbols by splitting check nodes of a base graph associated with the daughter code; and generating a second, remaining subset of the new code symbols by constrained edge growth of the base graph.

5. The method of claim 2 wherein:
the data message is encoded at the designated rate; and
the method further comprises optimizing the LDPC code for the designated rate.

6. The method of claim 5 wherein the LDPC code is optimized based on an extrinsic-information transfer (EXIT) chart.

7. The method of claim 6 wherein:
the daughter code is extended by introducing a set of new code symbols to the daughter code;
the number of new code symbols is a function of the rate of the daughter code and the designated rate;
a first subset of the new code symbols is generated by splitting check nodes of a base graph associated with the daughter code; and
a second, remaining subset of the new code symbols is generated by constrained edge growth of the base graph.

8. The method of claim 5 wherein optimization constraints of the LDPC optimization procedure are given by: (i) check-degree distributions and variable-degree distributions of the base graph; and (ii) the designated rate.

9. A data communications method comprising the steps of:
encoding at least a portion of a data message using a rate-compatible parity check matrix of a low density parity check (LDPC) code; and
transmitting the encoded data message over a communication channel;
wherein the LDPC code is derived from a base code though at least one extension operation, said operation including constrained edge growth and parity splitting of the base code.

10. The method of claim 9 wherein:
the LDPC code is an irregular LDPC code; and
the base code is an LDPC daughter code having a code rate higher than a designated code rate of the irregular LDPC code.

11. The method of claim 10 further comprising:
generating redundant data for transmission over the communication channel based on at least one of a redundancy determination by a transmitting unit and feedback received from a receiving unit, wherein the redundant data is generated using at least one linear block code encoding operation.

12. The method of claim 10 further comprising:
receiving the encoded data message over the communication channel; and
decoding the encoded data message in a puncture-less manner, wherein the encoded data message is decoded by a decoding unit that operates only on a parity-check submatrix corresponding to the designated rate.

13. The method of claim 10 wherein:
the data message is encoded at the designated rate; and
the method further comprises optimizing the LDPC code for the designated rate.

14. The method of claim 13 wherein the LDPC code is optimized based on an extrinsic-information transfer (EXIT) chart.

15. The method of claim 13 wherein:
the extension operation comprises introducing a set of new code symbols to the daughter code;
the number of new code symbols is a function of the rate of the daughter code and the designated rate.

16. The method of claim 15 further comprising:
generating a first subset of the new code symbols by splitting check nodes of a base graph associated with the daughter code; and
generating a second, remaining subset of the new code symbols by constrained edge growth of the base graph.

17. The method of claim 16 further comprising:
optimizing the first and second subsets, as relating to the number of new code symbols in each subset.

18. The method of claim 16 wherein optimization constraints of the LDPC optimization procedure are given by: (i) check-degree distributions and variable-degree distributions of the base graph; and (ii) the designated rate.

19. A method of generating a rate-compatible, irregular low density parity check (LDPC) code having a designated coding rate, said method comprising:
extending a base LDPC code having a rate higher than the designated coding rate;
wherein the base LDPC code is extended using a constrained edge growth operation and a parity splitting operation on the base code; and
wherein the LDPC code is optimized for the designated rate.

20. The method of claim 19 wherein:
the base code is extended by introducing a set of new code symbols to the base code, wherein (i) a first subset of the new code symbols is generated by splitting check nodes of a base graph associated with the base code and (ii) a second, remaining subset of the new code symbols is generated by constrained edge growth of the base graph; and
the number of new code symbols is a function of the rate of the base code and the designated rate.

* * * * *